(12) United States Patent
Zhang et al.

(10) Patent No.: US 10,404,445 B1
(45) Date of Patent: Sep. 3, 2019

(54) DATA RECEIVER CIRCUIT AND METHOD OF RECEIVING DATA

(71) Applicant: Xilinx, Inc., San Jose, CA (US)

(72) Inventors: Hongtao Zhang, San Jose, CA (US); Jinyung NamKoong, San Jose, CA (US); Winson Lin, San Francisco, CA (US); Yohan Frans, Palo Alto, CA (US); Geoffrey Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/026,967

(22) Filed: Jul. 3, 2018

(51) Int. Cl.
H03D 3/24 (2006.01)
H04L 7/00 (2006.01)
H04L 7/033 (2006.01)
H03L 7/081 (2006.01)

(52) U.S. Cl.
CPC .......... *H04L 7/0025* (2013.01); *H03L 7/0812* (2013.01); *H04L 7/0012* (2013.01); *H04L 7/0079* (2013.01); *H04L 7/0337* (2013.01)

(58) Field of Classification Search
CPC ... H04L 7/0025; H04L 7/0079; H04L 7/0012; H04L 7/0337; H03L 7/0812
USPC ................................. 375/316, 376
See application file for complete search history.

(56) References Cited

U.S. PATENT DOCUMENTS

| 7,127,022 | B1 | 10/2006 | Dieguez |
| 7,184,511 | B2 | 2/2007 | Younis et al. |
| 7,233,182 | B1* | 6/2007 | Savoj ............ H03L 7/0812 327/141 |
| 7,512,848 | B1 | 3/2009 | Abughazaleh |
| 7,515,668 | B1* | 4/2009 | Rokhsaz ............ H04L 7/033 375/340 |
| 7,568,137 | B1 | 7/2009 | Kellermann |
| 8,253,451 | B1 | 8/2012 | Hsieh et al. |
| 8,917,803 | B1 | 12/2014 | Asuncion et al. |
| 8,923,463 | B1 | 12/2014 | Jenkins et al. |
| 8,958,513 | B1 | 2/2015 | Novellini et al. |
| 9,065,601 | B1 | 6/2015 | Jenkins et al. |
| 9,209,960 | B1 | 12/2015 | Leung et al. |
| 9,306,730 | B1 | 4/2016 | Shu et al. |
| 9,313,017 | B1 | 4/2016 | Liao et al. |
| 9,356,775 | B1 | 5/2016 | Xu et al. |
| 9,379,720 | B1 | 6/2016 | Xu et al. |
| 9,379,880 | B1 | 6/2016 | Xu et al. |
| 9,438,409 | B1 | 9/2016 | Liao et al. |
| 9,455,848 | B1 | 9/2016 | Zhang et al. |
| 9,698,970 | B1 | 7/2017 | Cho |
| 2005/0238129 | A1* | 10/2005 | Ishida ............ G11B 20/18 375/376 |
| 2006/0250192 | A1* | 11/2006 | Hsieh ............ H03L 7/087 331/16 |

* cited by examiner

Primary Examiner — Don N Vo
(74) Attorney, Agent, or Firm — John J. King

(57) ABSTRACT

A receiver circuit for receiving data is described. The receiver circuit comprises a phase detector configured to receive an input data signal; a frequency path circuit configured to receive an output of the phase detector; and a false lock detection circuit configured to receive the output of the phase detector and an output of the frequency path circuit; wherein the false lock detection circuit detects a false lock of the receiver circuit to the input data signal based upon an output of the phase detector and provides a frequency offset to the frequency path circuit. A method of receiving data is also described.

20 Claims, 6 Drawing Sheets

DATA RECEIVER CIRCUIT AND METHOD OF RECEIVING DATA

TECHNICAL FIELD

The present invention relates generally to integrated circuit devices, and in particular to a receiver circuit and a method of receiving data.

BACKGROUND

Clock and data recovery (CDR) is widely used in high speed Serializer-Deserializer (SerDes) systems to recover the embedded clock information from a received data signal. In a typical CDR implementation, a phase detector (PD) and a phase interpolator PI are provided, where a first order path (i.e. a phase path) gain and a second order path (i.e. frequency path) gain are implemented.

In the CDR locked state, the phase path tracks the instantaneous phase difference between the received data and the local clock within its loop bandwidth and loop gain range, while the frequency path periodically updates the PI to track the averaged frequency offset within its tracking range.

The CDR phase detector only provides phase difference information, but not frequency difference information, measured by parts per million (ppm). When the frequency difference between the transmitted signal and the local clock is outside the CDR frequency capture range, the CDR frequency path could lock to an incorrect frequency, i.e. an incorrect ppm offset, especially when the incoming signal also contains a large sinusoidal clock jitter. When this happens, the recovered data may be wrong.

Accordingly, there is a need for a clock and data recovery circuit that reduces locking to an incorrect frequency.

SUMMARY

A receiver circuit for receiving data is described. The receiver circuit comprises a phase detector configured to receive an input data signal; a frequency path circuit configured to receive an output of the phase detector; and a false lock detection circuit configured to receive the output of the phase detector and an output of the frequency path circuit; wherein the false lock detection circuit detects a false lock of the receiver circuit to the input data signal based upon an output of the phase detector and provides a frequency offset to the frequency path circuit.

A method of recovering date is also described. The method comprises configuring a phase detector to receive an input data signal; configuring a frequency path circuit to receive an output of the phase detector; and configuring a false lock detection circuit to receive the output of the phase detector and an output of the frequency path circuit; detecting, using the false lock detection circuit, a false lock of the receiver circuit to the input data signal based upon an output of the phase detector; and providing a frequency offset to the frequency path circuit.

DETAILED DESCRIPTION

The circuits and methods set forth below provide CDR false locking detection in the presence of periodic jitter, such as in an asynchronous system, to achieve a true locking. The circuits and methods not only detect the false locking condition, but also attempt to lock to the correct frequency. The CDR capture range is essentially widened by detecting false looking conditions and enabling correction.

According to some implementations, a receiver circuit may comprise a phase detector configured to receive an input data signal and a frequency path configured to receive an output of the phase detector. A false lock detection circuit may be configured to receive the output of the phase detector and an output of the frequency path, wherein the false lock detection circuit detects a false lock of the receiver circuit to the input data signal based upon an output of phase detector and provides a frequency offset to the frequency path.

According to other implementations, the frequency path may comprise a register coupled to receive the duty cycle, and a false lock of the receiver circuit to the input data signal is detected based upon the duty cycle. The false lock of the receiver circuit to the input data signal may also be detected based upon the duty cycle crossing difference of an accumulated phase detector output. A phase interpolator 320 may be coupled to receive an output of the phase path and generate the recovered clock, and a latch 322 to generate the recovered data based upon the input data using the recovered clock.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
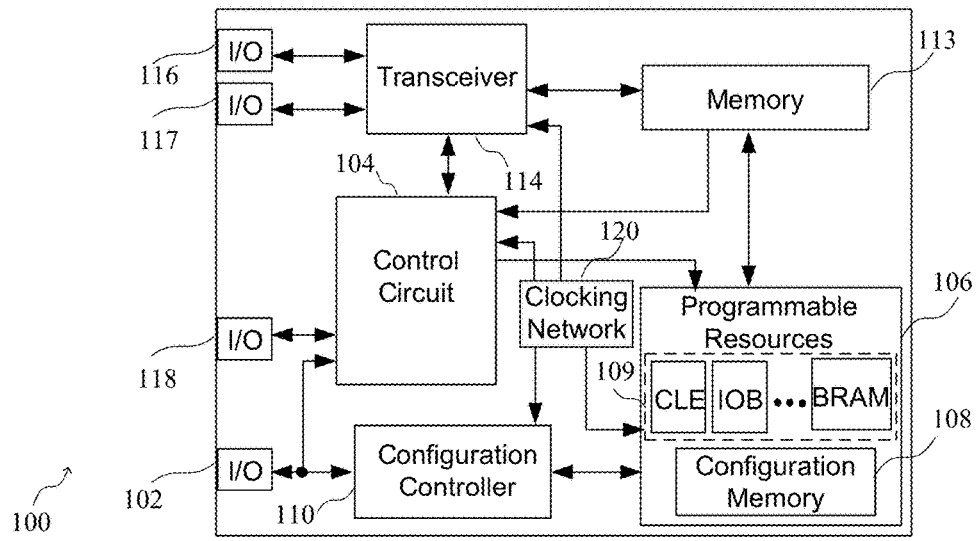
FIG. 1 is a block diagram of an integrated circuit having circuits for transmitting and receiving data.

Turning first to FIG. 1, a block diagram of an integrated circuit device 100 having a transceiver for transmitting and receiving data is shown. In particular, an input/output port 102 is coupled to a control circuit 104 that controls programmable resources 106 having configurable logic elements 109 and other programmable resources, such as input/output blocks (IOBs) and blocks of random access memory (BRAMs). Configuration data may be provided to the configuration memory 108 by a configuration controller 110. The configuration data enables the operation of the programmable resources 106. A memory 113 may be coupled to the control circuit 104 and the programmable resources 106. A transceiver circuit 114, which may comprise a transmitter and a receiver for example, may be coupled to the control circuit 104, programmable resources 106 and the memory 113, and may receive signals at the integrated circuit by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. While the circuit of FIG. 1 is provided by way of example, the circuits for and methods of implementing a circuit for receiving data can use other circuit elements. A more detailed example of an integrated circuit that can implement the circuits of FIG. 1 is shown by way of example in FIGS. 11 and 12.

Figure 2:
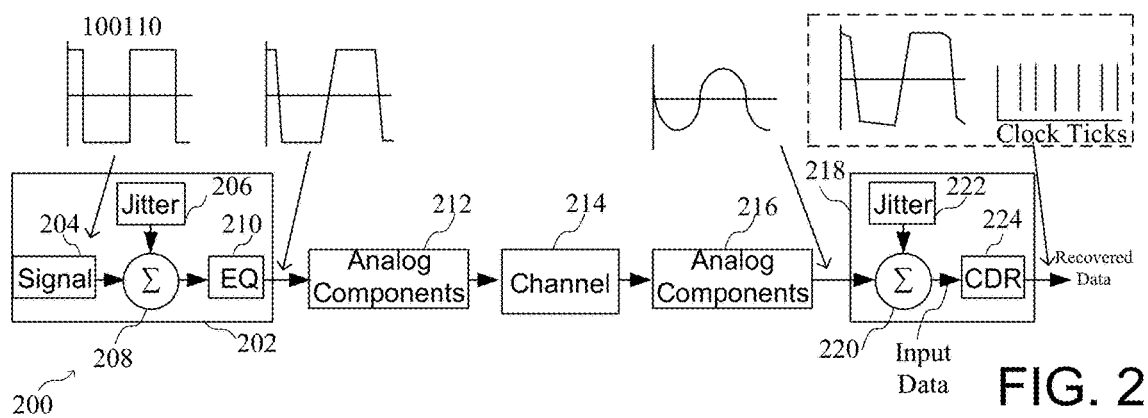
FIG. 2 is a block diagram of system for receiving data that may include the integrated circuit of FIG. 1 having circuits for transmitting and receiving data.

Turning now to FIG. 2, a block diagram of system 200 for receiving data that may include the integrated circuit of FIG. 1 having circuits for transmitting and receiving data is shown. The system 200 comprises elements on opposite sides of a channel for the transmission of data from a transmitter to a receiver. More particularly, a transmitter 202 comprises a first signal generator 204, and a second signal generator 206, shown here as a sinusoidal jitter (SJ) signal generator, the outputs of each of which are coupled to a summing circuit 208. The output of the first signal generator comprise a series of digital bits exposed to jitter. It should be noted that the circuit of FIG. 2 shows an example of a signal path simulator, where jitter is introduced on the transmitter and the receiver side to simulate jitter that may be present in the signal. An output of the summing circuit 208 is coupled to an equalizer 210, which generates an equalized output signal. The equalized output signal is coupled to analog components 212 which generate an analog signal that is provided to the channel 214. Analog components 216 on the other end of the channel generate an analog input signal to be received by a receiver 218. The receiver 218 comprises a summing circuit configured to receive the analog input signal and a signal from a third signal generator 222, shown here as another sinusoidal jitter signal generator 222 to represent jitter in the received signal. A CDR circuit 224 receives an output of the summing circuit 220 to generate the recovered data signal and recovered clock.

In a typical transmitter (TX) model, the analog portion models rise and fall waveforms and the output impedance, and a delay-locked loop (DLL) models the de-emphasis. In a typical receiver (RX) model, the analog portion represents the input termination and the DLL the functionalities of automatic gain control (AGC), equalization (such as continuous time linear equalization (CTLE), feed forward equalization (FFE) and decision feedback equalizer (DFE)) and CDR. A TX DLL output is considered an ideal voltage source, and a RX DLL input is assumed to have high impedance. Therefore, DLLs are electrically decoupled from the analog channel, which includes the TX analog model, the physical channel and the RX analog model. Furthermore, the analog channel is assumed to be a linear time invariant (LTI) system, thus can be represented by a combined analog channel impulse response.

A PLL in a SerDes is used to sync the local clock frequency with the reference clock frequency and also to multiply the reference clock frequency up for the actual data rate. In a synchronous system, the receiver PLL and the transmitter PLL gets the same reference clock, while in an asynchronous system, the reference clock frequency to the RX PLL and to the TX PLL could be different. One approach for clock recovery is to have a phase-frequency detector (PFD) of a clock and date recovery circuit on the RX side to directly adjust the PLL frequency. When there is no data or no lock the internal PLL will normally frequency/phase lock onto the reference clock. Once the SerDes receiver starts to receive data, the PLL clock is compared in frequency and phase in a PFD to generate the error signal, which is then used to adjust the PLL in such a way that the incoming data is more or less sampled around the bit center. The elements of the system of FIG. 2 could be implemented in different integrated circuits, such as the integrated circuit of FIG. 1 for example, or some other integrated circuit device. Further, the CDR circuit 224 of FIG. 2 could be implemented according to the circuit of FIG. 3.

Figure 3:
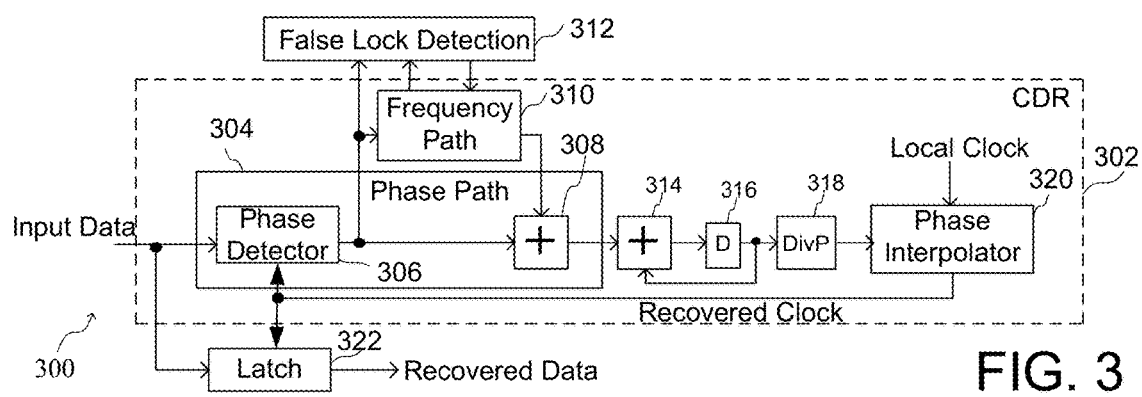
FIG. 3 is a block diagram of a circuit for receiving data.

Turning now to FIG. 3, a block diagram of a circuit for receiving data is shown. More particularly, a CDR circuit 300 comprises a phase path 304 having an input for receiving input data coupled to a phase detector 306 and a summing circuit 308. The phase detector 306 determines an increase or a decrease in a phase of a signal, and therefore whether to adjust the phase of the recovered clock. A frequency path circuit 310 is coupled to an output of the phase detector 310 and a false detection lock 312. The false locking detection circuit determines a false lock based upon a change in an output of the phase detector. According to one example, the false lock detection circuit determines a false lock based upon and accumulated output of the phase detector, as will be described in more detail in reference to FIG. 8. An output of the summing circuit 308 is coupled to another accumulator comprising a summing circuit 314 that is also coupled to receive an output of a register 316. An output of the register 316 is coupled to a divider 318, which controls the gain of phase path. A phase interpolator 314 receives the output of the divider 318 to generate the recovered clock signal.

The false lock detection circuit 312 provides CDR false locking detection in the presence of periodic jitter in an asynchronous system to achieve a true locking. As will be described in more detail below, the false lock detection circuit 312 can detect duty cycle distortion associated with an accumulated phase detector output. The false lock detection circuit can also determine whether a mean accumulated phase detector output is biased away from the accumulated phase detector output range. According to other implementations, the accumulated phase detector output could count the crossing difference at the top and bottom of the accumulated phase detector output to determine if the CDR circuit is falsely locked and to determine a sign of an offset. A period of the crossing of the accumulated phase detector output could be used to determine a magnitude of the offset. The circuit for receiving data of FIG. 3 could be implemented in the receiver 218 such as in the CDR 224, which would be implemented in an integrated circuit device, such as the integrated circuit of FIG. 1.

Figure 4:
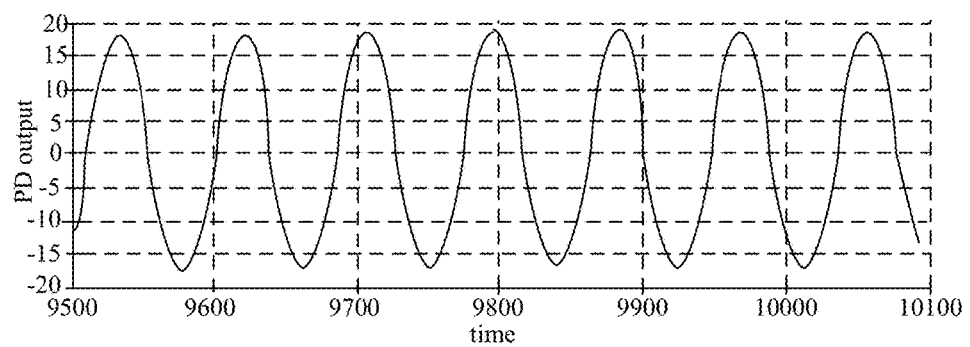
FIG. 4 is a timing diagram of a phase detector output.
Figure 5:
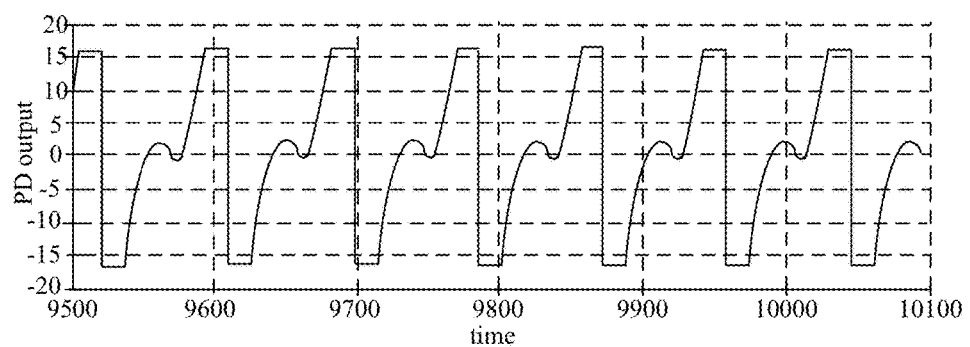
FIG. 5 is a timing diagram of a phase detector output having a positive offset.
Figure 6:
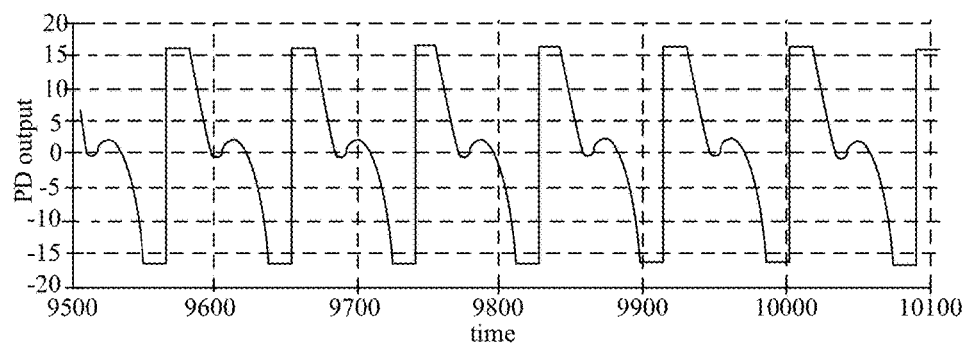
FIG. 6 is a timing diagram of a phase detector output having a negative offset.

Turning now to FIGS. 4-6, timing diagrams of a phase detector output are shown. FIG. 4 shows an example of a PD output when a CDR circuit is truly locked to an input signal having a 300 ppm offset and a 0.1 UI sinusoidal jitter at 5 MHz, while FIGS. 5 and 6 show two examples of PD outputs when a CDR circuit is falsely-locked, having a 0.2 UI sinusoidal jitter at 5 MHz with a 300 ppm offset for FIG. 5 and with a −300 ppm offset for FIG. 6. It is seen that the patterns of the PD outputs are significantly different when a CDR circuit is truly locked versus falsely locked. When a CDR circuit is truly locked, the PD output changes continuously. When a CDR circuit is falsely locked, the PD output changes abruptly which corresponds to a CDR bit slip (when a unit interval (UI) is missed). A delta part per million (ppm) offset, also known as a frequency offset, which is the difference between the true ppm offset and the CDR falsely locked ppm offset, can be calculated from the period of this bit slip. The sign of the delta ppm depends on the sign of the sudden change. If the sudden change is negative as shown in FIG. 5, then the delta ppm is positive. If the sudden change is positive as shown in FIG. 6, then the delta ppm is negative.

Figure 7:
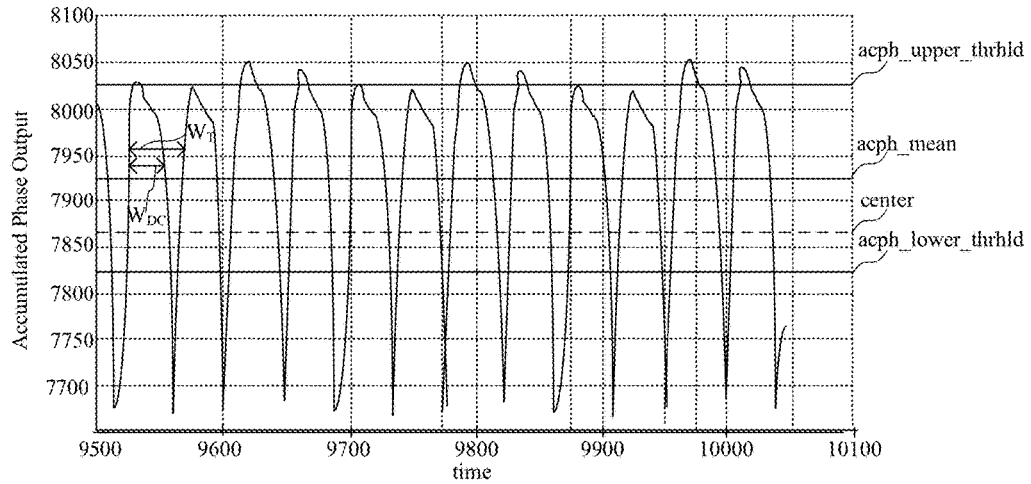
FIG. 7 is a timing diagram of an accumulated phase detector output when the phase detector output has a negative offset.

Turning now to FIG. 7, a timing diagram of an accumulated phase detector output when the phase detector output has a negative offset is shown. FIG. 7 shows the accumulated PD output when CDR circuit is falsely locked for a signal with a 0.2 UI SJ at 10 MHz and a frequency offset of −300 ppm. If the PD output is very noisy and the sudden change of PD output is affected by the noise, it is possible to rely on the accumulated PD output signature of FIG. 7 for false locking detection. It is observed that when falsely locked, the accumulated PD output is severely duty-cycle distorted and the mean (the middle line in FIG. 7) is biased away from the center of the accumulated PD output range. As will be described in more detail in reference to FIG. 8, it is possible to use the duty cycle (the portion $W_{DC}$ of the total WT) to determine if the CDR circuit is falsely locked. For example, if $W_{DC}$ is not approximately half of WT, this duty cycle distortion would be a part of an accumulated phase output signature would indicate a false locking situation. Alternatively, it is also possible to count the crossing differences at an upper threshold line and a lower threshold line, such as the acph_upper_thrhold line and achp_lower_thrhld line as shown in FIG. 7, to determine if the CDR circuit is falsely locked and to determine the sign of a delta ppm offset. The acph_upper_thld and acph_lower_thrhld values can be chosen as fixed offsets away from the mean. For example, acph_upper_thld can be at acph_mean+offset and acph_lower_thld can be acph_mean−offset, where offset can be chosen as, for example, 25% of the range (max value−min value). If there is little duty cycle distortion, the mean of the accumulated phase output would be very close to the mid-point or the center of the accumulated phase output. The crossing (rise or fall) count within a fixed time window at acph_upper_thld and acp_lower_thld would be very similar. If there is duty cycle distortion, the mean of the accumulated phase output would be different from the mid-point or the center of the accumulated phase output. As a result, the crossing (rise or fall) count within a fixed time window at acph_upper_thld and acp_lower_thld would also be different. Therefore, it is possible to determine whether or not there is a CDR false-lock and the sign of the delta ppm offset by the crossing count difference at the acph_upper_thld and acp_lower_thld. If the difference is deemed large enough, we can then determine the magnitude of the delta ppm offset by the crossing count (and hence the period) at the mean.

Figure 8:
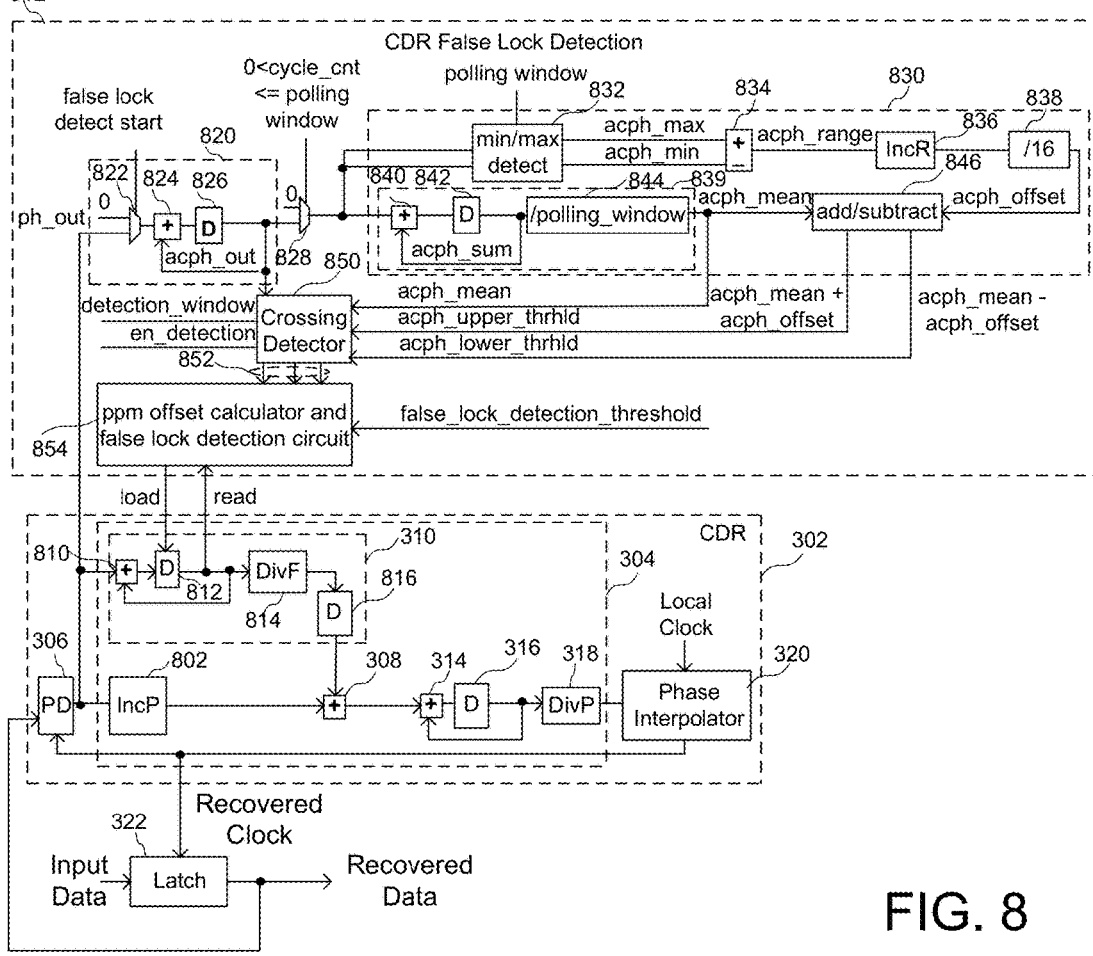
FIG. 8 is a block diagram of a clock and data recovery circuit having a false lock detection circuit.

Turning now to FIG. 8, a block diagram of a clock and data recovery circuit having a false lock detection circuit is shown. More particularly, the CDR circuit 302 comprises the phase detector 304 which generates a phase output (ph_out) signal that is coupled to the frequency path 310 and other portions of the phase path 304. The phase path 304 comprises increment phase block 802, an output of which is coupled to a first summing circuit 308 that also receives an output of the frequency path 310. An output of the first summing circuit is coupled to a second summing circuit 314 that also receives a feedback signal from a register 316, which operates as a delay element. An output of the register 316 is coupled to a divider 318, which represents a phase gain stage.

The frequency path 310 comprises a summing circuit 810 coupled to receive the phase detector output and a feedback signal from a register 812. The register 812 receives a load signal from the false lock detection circuit 310, as will be described in more detail below. The load signal may be a calculated frequency offset between the receiver clock and the transmitter clock. The calculated frequency offset is the sum of what was read from the frequency path register 812 and the calculated delta_ppm_offset, and is loaded into the register after a load trigger from the false lock detection circuit. An output of the register 812, designated as a read signal, is provided to the false lock detection circuit 310 and to a frequency divider 814 (which represents a gain stage of the frequency path), an output of which is provided to a register 816 and the summing circuit 308.

The false lock detection circuit 312 comprises a false lock detection start circuit 820 adapted to receive a false lock detect start signal at a control input of a multiplexer 822 that receives the phase detector output and a logical zero ("0") at inputs. A summing circuit 824 receives an output of the multiplexer 822 and a feedback output (acph_out) of a register 826. An output of the false lock detection start circuit 820, which is the accumulated phase output (acph_out) signal generated as an output of the register 826, is coupled to a first input of another multiplexer 828 that is coupled to receive a logical zero at a second input. An output of the multiplexer 828, which is selected in response to a selection signal based upon a cycle count according to the condition that 0<cycle_cnt<=polling window to generate an accumulated phase output sum (acph_sum).

An output of the multiplexer 828 is coupled to an offset calculation circuit 830, and more particularly, to a minimum/maximum detection circuit 832 that is adapted to receive a polling window value. The maximum of the accumulated phase output (acph_out), designated as the acph_max, and the minimum of the accumulated phase output, designated as the acph_min are generated by the minimum/maximum detection circuit 832. The acph_max and acph_min are coupled to inputs of a range generation circuit 834 to generate an accumulated phase range (acph_range) signal. The acph_range signal is coupled to an increment circuit (IncR) 836 which enables multiplying the acph_range, such as by a factor of 2 for example. A divide-by-16 circuit 838 is coupled to the output of the increment circuit 836. That is, the increment circuit 836 and the divide-by-16 circuit 838 provide a weighting factor that adjusts how fast crossing detection signals can be generated. For example, if IncR is set to 4, then an accumulated phase output offset (acph_offset) is 25% of achp_range, so the calculated accumulated phase output upper threshold (acph_upper_thrhld) is at the 75th percentile while the accumulated phase output lower threshold (acph_lower_thrhld) is at the 25th percentile for crossing detection. Acph_offset is used to determine a threshold offset relative to an acph_mean, which is approximately the 50th percentile.

The output of the multiplexer 828 is also coupled to an accumulated phase mean value generator 839 having a summing circuit 840 that receives an accumulated phase output sum (acph_sum) generated by a register 842. The acph_sum is also provided to a divide-by-polling window block 844, an output of which represents a mean value of the acph_sum (acph_mean). The mean value acph_mean and the acph_offset are provided to an add/subtract circuit 846. The add/subtract circuit 846 generates the accumulated phase output upper threshold value (acph_upper_threshold), which is equal to the acph_mean plus the acph_offset, and the accumulated phase output lower threshold value (acph_lower_threshold), which is the acph_mean minus the acph_offset. Each of the acph_mean, the acph_upper_threshold and the acph_lower_threshold are provided to a crossing detector 850, which is also coupled to receive a detection window (detection_window) signal and a detection enable (en_detection) signal to generate crossing detector outputs 852. The crossing dectector outputs may comprise count values including for example a mean count (cnt_mean), an upper count (cnt_upper), and a lower count (cnt_lower) that are used by a ppm offset calculator and false lock detection circuit 854 based upon a false lock detection threshold (false_lock_detection_threshold) value.

During operations when the false lock detects start signal goes from 0 to 1 for example, a cycle count (cycle_cnt) starts to increase by 1 for every cycle and the detection procedure starts. The phase detector output (ph_out) will be accumulated to an accumulated phase detector output (acph_out). During a polling stage when 0<cycle_cnt<=polling_window, acph out is further accumulated for a specified polling window (which may be for example 8192 cycles, but can be 4096×2, 4049×4 and 4096×16 or any other number) to generate the acph_sum. Maximum and minimum values (acph_max/acph_min) of acph_out signal within polling window are also detected. When cycle_cnt=polling_window+1, the acph-sum is divided by the polling window to get the accumulated phase out mean (acph_mean). In addition, the acph range (acph_max−acph_min) is calculated, and the acph_offset is calculated by scaling the acph range by a factor of IncR/16.

Three thresholds, acph_mean, acph_upper_thrhld (acph_mean+acph_offset) and acph_lower_thrhld (acph_mean−acph_offset) are calculated for a detection stage when polling_window+1<cycle_cnt<=polling_window+1+detection_window to be used by the crossing detector. During the detection stage at the rising transition edge of the acph_out, acph mean, acph_upper_thrhld and acph_lower_thrhld signals are counted and stored as cnt_mean, cnt_upper and cnt_lower. Then during a PPM Offset Calculation Stage, when cycle_cnt=polling_window+detection_window+2 at the end of the detection stage, where 2 is an arbitrary number that could be changed, delta_cnt, which is the difference of cnt_upper and cnt_lower, is calculated and compared with a user-defined false lock detection threshold, which may be for example an 8-bit number, default decimal 10. If the delta_cnt exceeds the false lock detection threshold, then a false lock is detected and the correction is made by way of the load signal.

More particularly, a delta ppm offset is calculated as delta ppm offset=cnt_mean/detection window*divP*divF*64, where cnt_mean represents a count of the crossing at the mean, divP and divF are divider values associated with phase and frequency gain stages, and 64 may be a bus width for example. According to one example, the detection window could be 8000 cycles. The frequency path accumulator value is then read out. If delta cnt is greater than the false lock detection threshold, then the frequency path accumulator value is subtracted from delta ppm offset and the difference freq_cnt_overwrite_val is stored, and freq_cnt_load is set to 1 to enable loading the freq_cnt_overwrite_val. If delta cnt is less than the negative value of false lock detection threshold, then frequency path accumulator value is added to delta ppm offset, and the summation to freq_cnt_overwrite_val is stored and freq_cnt_load is set to 1.

In a frequency counter load stage, the cycle count is calculated, where cycle_cnt=polling_window+detection_window+3. During this stage, the freq_cnt_overwrite_val is loaded to the frequency accumulator if freq_cnt_load is enabled and then freq_cnt_load and cycle_cnt both reset to 0.

Figure 9:
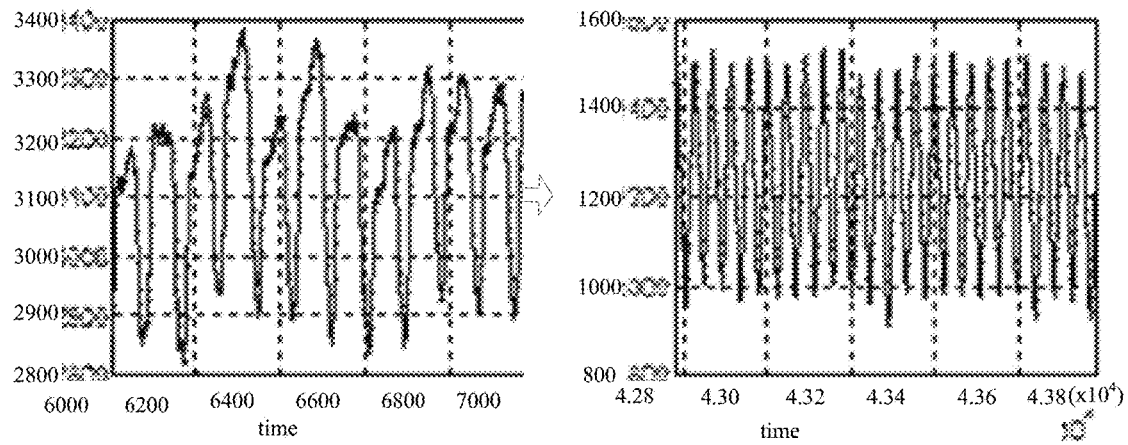
FIG. 9 is a timing diagram showing outputs of an accumulated phase detector with and without the use of a false lock detection circuit of a clock and data recovery circuit.

Turning now to FIG. 9, a timing diagram shows outputs of an accumulated phase detector with and without the use of a false lock detection circuit of a clock and data recovery circuit for a signal with a 0.2 US SJ at 10 MHz and −200 ppm. The timing diagram on the left shows the accumulated phase detector output without the use of the false lock detection circuit, and the timing diagram on the right shows the accumulated phase detector output with the use of the false lock detection circuit.

Table I showed simulated BER with and without the proposed detection and fix method. As can be seen in the table, there is no CDR false lock when the false lock detection circuit is implemented.

TABLE 1

| Freq. Offset (ppm) | SJ Freq. (MHz) | False Lock Detect Circuit implemented? | SJ Amp (UI) | BER |
|---|---|---|---|---|
| +200 | 10 | No | 0.05 | 2.03E−07 |
|  |  | No | 0.10 | CDR False Lock |
|  |  | Yes | 0.05 | 9.60E−07 |
|  |  | Yes | 0.10 | 2.31E−05 |
| −200 | 5 | No | 0.05 | 1.43E−08 |
|  |  | No | 0.12 | CDR False Lock |
|  |  | Yes | 0.05 | 1.43E−08 |
|  |  | Yes | 0.12 | 3.50E−09 |

Figure 10:
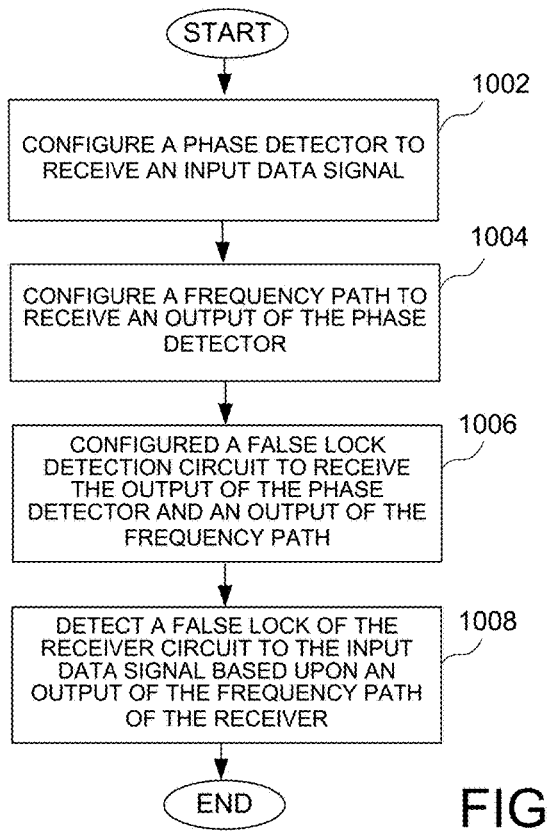
FIG. 10 is a flow chart showing a method of receiving data using a clock and data recovery circuit having a false lock detection circuit.

Turning now to FIG. 10, a flow chart shows a method of receiving data using a clock and data recovery circuit. More particularly, a phase detector, such as the phase detector 306, is configured to receive an input data signa at a block 1002. A frequency path, such as frequency path 310, is configured to receive an output of the phase detector at a block 1004. A false lock detection circuit, such as frequency lock detection circuit 312, is configured to receive the output of the phase detector and an output of the frequency path at a block 1006. A false lock of the receiver circuit to the input data signal based upon an output of the frequency path of the receiver is detected at a block 1008.

The method of FIG. 10 may be implemented using the circuits of FIGS. 1-8 as described, or using some other suitable circuits. While specific elements of the method are described, it should be understood that additional elements of the method, or additional details related to the elements, could be implemented according to the disclosure of FIGS. 1-8.

Figure 11:
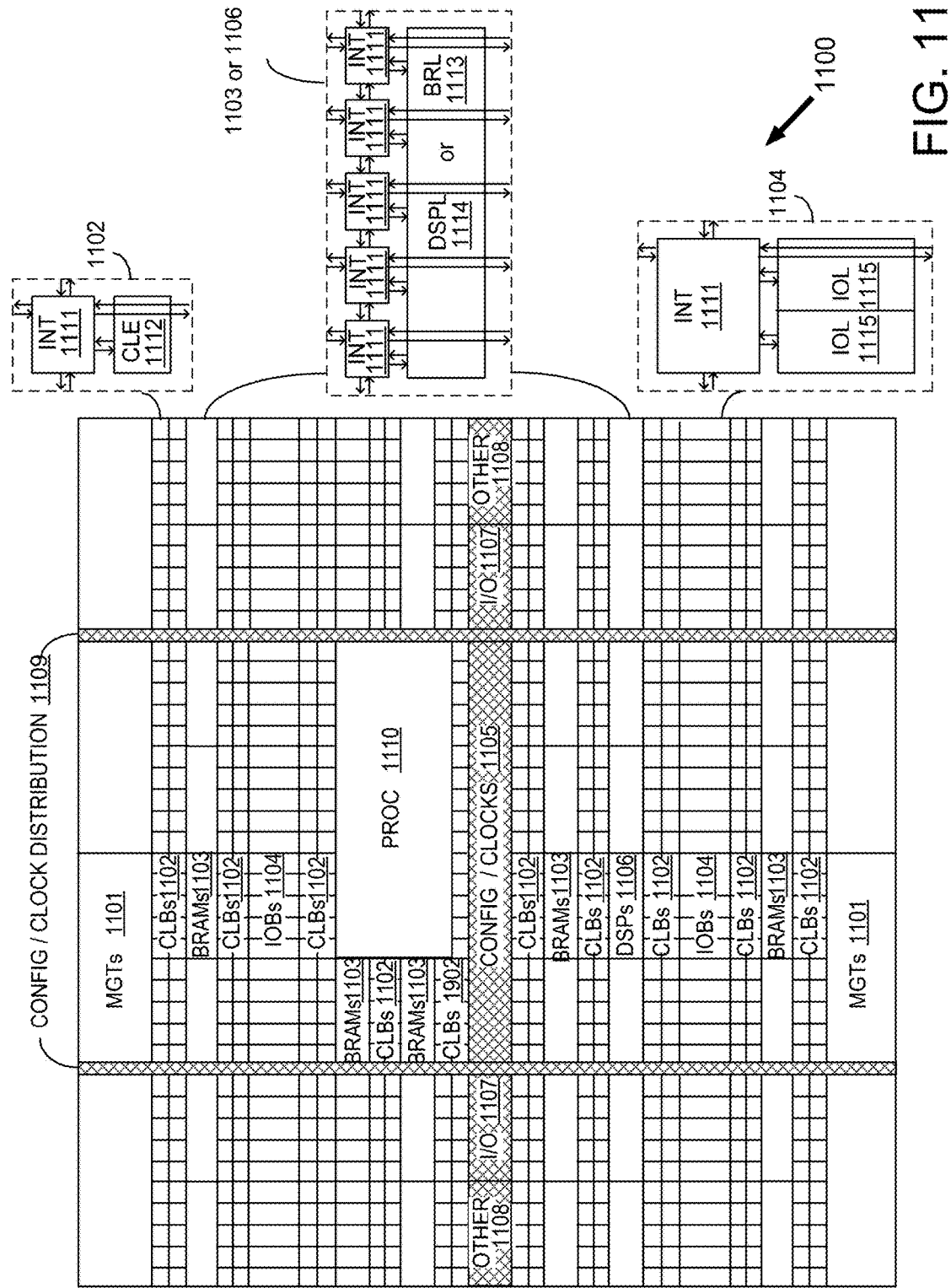
FIG. 11 is a block diagram of an integrated circuit having programmable resources.

Turning now to FIG. 11, a block diagram of an integrated circuit having programmable resources is shown, where the circuits of FIGS. 1, 3 and 8 could be implemented in the integrated circuit of FIG. 11. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 11 comprises an FPGA architecture 1100 having a large number of different programmable tiles including multi-gigabit transceivers (MGTs) 1101, CLBs 1102, random access memory blocks (BRAMs) 1103, input/output blocks (IOBs) 1104, configuration and clocking logic (CONFIG/CLOCKS) 1105, digital signal processing blocks (DSPs) 1106, specialized input/output blocks (I/O) 1107 (e.g., configuration ports and clock ports), and other programmable logic 1108 such as digital clock managers, analog-to-digital converters, system monitoring logic, and so forth. Some FPGAs also include dedicated processor blocks (PROC) 1110, which may be used to implement a software application, for example.

In some FPGAs, each programmable tile includes a programmable interconnect element (INT) 1111 having standardized connections to and from a corresponding interconnect element in each adjacent tile. Therefore, the programmable interconnect elements taken together implement the programmable interconnect structure for the illustrated FPGA. The programmable interconnect element 1111 also includes the connections to and from the programmable logic element within the same tile, as shown by the examples included at the top of FIG. 11.

For example, a CLB 1102 may include a configurable logic element (CLE) 1112 that may be programmed to implement user logic plus a single programmable interconnect element 1111. A BRAM 1103 may include a BRAM logic element (BRL) 1113 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 1106 may include a DSP logic element (DSPL) 1114 in addition to an appropriate number of programmable interconnect elements. An IOB 1104 may include, for example, two instances of an input/output logic element (IOL) 1115 in addition to one instance of the programmable interconnect element 1111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 1109 extending from this column are used to distribute the clocks and configuration signals across the breadth of the FPGA. Some FPGAs utilizing the architecture illustrated in FIG. 11 include additional logic blocks that disrupt the regular columnar structure making up a large part of the FPGA. The additional logic blocks may be programmable blocks and/or dedicated logic. For example, the processor block PROC 1110 shown in FIG. 11 spans several columns of CLBs and BRAMs.

Note that FIG. 11 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 11 are purely exemplary. For example, in an actual FPGA more than one adjacent column of CLBs is typically included wherever the CLBs appear in order to facilitate the efficient implementation of user logic. While the implementation of FIG. 11 relates to an integrated circuit having programmable resources, it should be understood that the circuits and methods set forth above could be implemented in any type of device having a combination of programmable resources and hard blocks.

Figure 12:
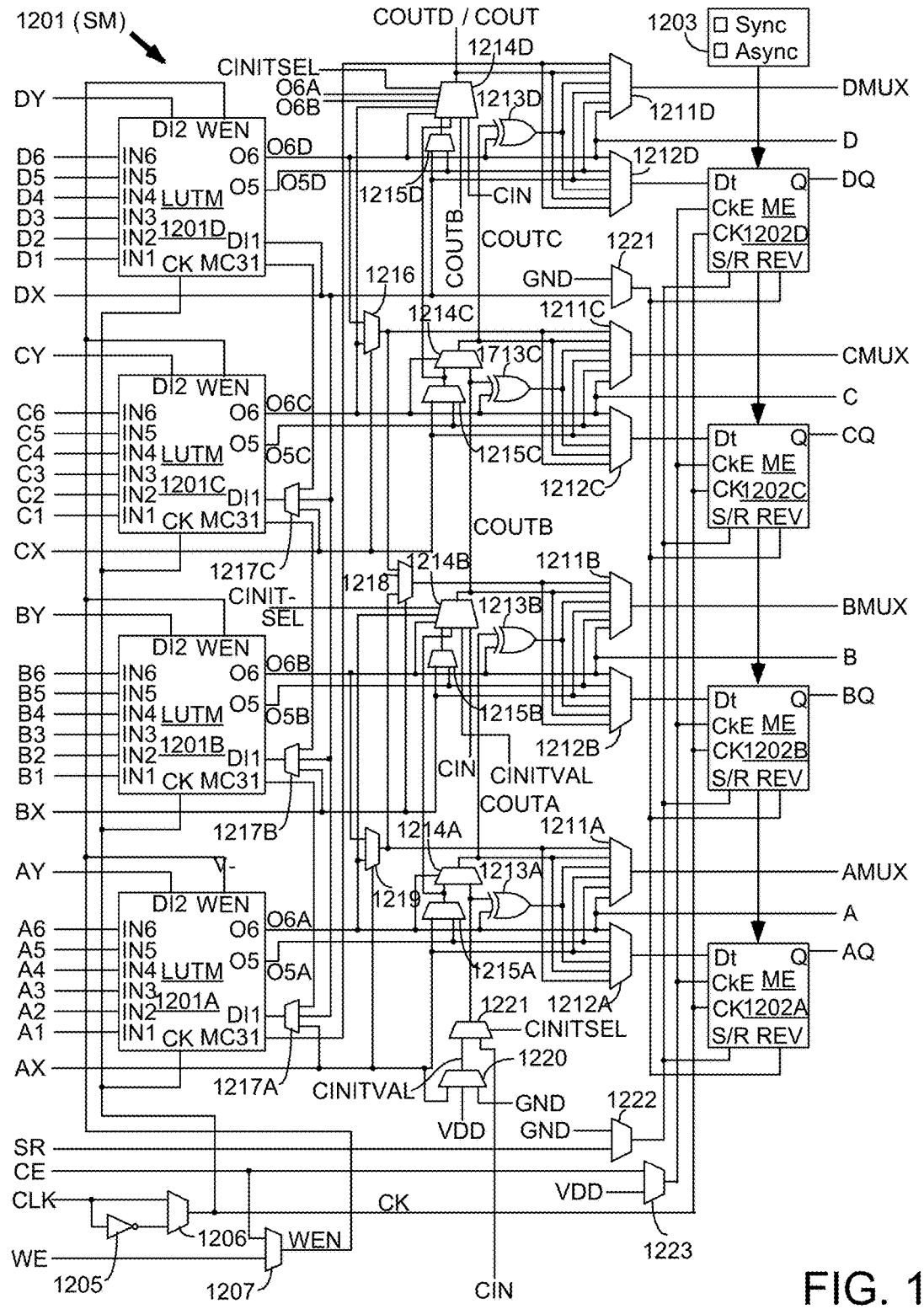
FIG. 12 is a block diagram of a configurable logic element that could be implemented in the integrated circuit of FIG. 11 and could implement a clock and data recovery circuit having a false lock detection circuit.

Turning now to FIG. 12, a block diagram of a configurable logic element that could be implemented in FIG. 11 is shown. In particular, FIG. 12 illustrates in simplified form a configurable logic element, which is an example of Programmable Logic, of a configuration logic block 1102 of FIG. 11. In the implementation of FIG. 12, slice M 1201 includes four lookup tables (LUTMs) 1201A-1201D, each driven by six LUT data input terminals A1-A6, B1-B6, C1-C6, and D1-D6 and each providing two LUT output signals O5 and O6. The O6 output terminals from LUTs 1201A-1201D drive slice output terminals A-D, respectively. The LUT data input signals are supplied by the FPGA interconnect structure via input multiplexers, which may be implemented by programmable interconnect element 1211, and the LUT output signals are also supplied to the interconnect structure. Slice M also includes: output select multiplexers 1211A-1211D driving output terminals AMUX-DMUX; multiplexers 1212A-1812D driving the data input terminals of memory elements 1202A-1202D; combinational multiplexers 1216, 1218, and 1219; bounce multiplexer circuits 1222-1223; a circuit represented by inverter 1205 and multiplexer 1206 (which together provide an optional inversion on the input clock path); and carry logic having multiplexers 1214A-1814D, 1215A-1815D, 1220-1221 and exclusive OR gates 1213A-1213D. All of these elements are coupled together as shown in FIG. 12. Where select inputs are not shown for the multiplexers illustrated in FIG. 12, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 18 for clarity, as well as from other selected figures herein.

In the pictured implementation, each memory element 1202A-1202D may be programmed to function as a synchronous or asynchronous flip-flop or latch. The selection between synchronous and asynchronous functionality is made for all four memory elements in a slice by programming Sync/Asynch selection circuit 1203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1202A-1202D are clocked by a clock signal CK, which may be provided by a global clock network or by the interconnect structure, for example. Such programmable memory elements are well known in the art of FPGA design. Each memory element 1202A-1202D provides a registered output signal AQ-DQ to the interconnect structure. Because each LUT 1201A-1201D provides two output signals, O5 and O6, the LUT may be configured to function as two 5-input LUTs with five shared input signals (IN1-IN5), or as one 6-input LUT having input signals IN1-IN6.

In the implementation of FIG. 12, each LUTM 1201A-1201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1217A-1217C for LUTs 1201A-1201C), or to the two 32-bit RAMs via input terminals DI1 and DI2. RAM write operations in the LUT RAMs are controlled by clock signal CK from multiplexer 1206 and by write enable signal WEN from multiplexer 1207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1201A may also be provided to the general interconnect structure for shift register chaining, via output select multiplexer 1211D and CLE output terminal DMUX. Accordingly, the circuits and methods set forth above may be implemented in a device such as the devices of FIGS. 11 and 12, or any other suitable device.

It can therefore be appreciated that new circuits for and methods of receiving data have been described. It will be appreciated by those skilled in the art that numerous alternatives and equivalents will be seen to exist that incorporate the disclosed invention. As a result, the invention is not to be limited by the foregoing implementations, but only by the following claims.

What is claimed is:

1. A receiver circuit for receiving data, the receiver circuit comprising:
   a phase detector configured to receive an input data signal;
   a frequency path circuit configured to receive an output of the phase detector; and
   a false lock detection circuit configured to receive the output of the phase detector and an output of the frequency path circuit;
   wherein the false lock detection circuit detects a false lock of the receiver circuit to the input data signal based upon an output of the phase detector and provides a frequency offset to the frequency path circuit.

2. The receiver circuit of claim 1, wherein the false lock detection circuit identifies a false lock of the receiver circuit by identifying a distorted duty cycle of an accumulated phase detector output.

3. The receiver circuit of claim 1, wherein the false lock detection circuit identifies a false lock of the receiver circuit based upon crossing differences at different locations of an accumulated phase detector output.

4. The receiver circuit of claim 1, further comprising a phase interpolator coupled to receive an output of a phase path having the phase detector and a local clock and to generate a recovered clock.

5. The receiver circuit of claim 1, wherein the frequency path circuit comprises a summing circuit configured to receive the output of the phase detector and a feedback signal from a register, wherein the register receives the frequency offset.

6. The receiver circuit of claim 1, wherein the false lock detection circuit further comprises a minimum and maximum detector receiving an accumulated phase output and detecting a maximum accumulated phase output and a minimum accumulated phase output used to generate an accumulated phase output offset.

7. The receiver circuit of claim 6, further comprising an adder/subtractor circuit configured to receive the accumulated phase output offset and an accumulated phase output mean, wherein the adder/subtractor circuit generates an accumulated phase output upper threshold and an accumulated phase output lower threshold.

8. The receiver circuit of claim 7, further comprising a crossing detector configured to receive the accumulated phase output mean, the accumulated phase output upper threshold and the accumulated phase output lower threshold, and generate crossing signals.

9. The receiver circuit of claim 8, wherein the false lock detection circuit is configured to identify a false lock of the receiver circuit in response to the crossing signals.

10. The receiver circuit of claim 8, further comprising a frequency offset calculator coupled to the crossing detector, wherein the frequency offset calculator generates the frequency offset that is coupled to the frequency path circuit to correct the phase of the output of the phase detector.

11. A method of receiving data, the method comprising:
    configuring a phase detector to receive an input data signal;
    configuring a frequency path circuit to receive an output of the phase detector;
    configuring a false lock detection circuit to receive the output of the phase detector and an output of the frequency path circuit;
    detecting, using the false lock detection circuit, a false lock of the receiver circuit to the input data signal based upon an output of the phase detector; and
    providing a frequency offset to the frequency path circuit.

12. The method of claim 11, wherein detecting a false lock of the receiver circuit comprises identifying a distorted duty cycle of an accumulated phase detector output.

13. The method of claim 11, wherein identifying a false lock of the receiver circuit comprises identifying crossing differences at different locations of an accumulated phase detector output.

14. The method of claim 11, further comprising coupling a phase interpolator to receive an output of a phase path having the phase detector and a local clock and to generate a recovered clock.

15. The method of claim 11, further comprising implementing, in the frequency path circuit, a summing circuit configured to receive the output of the phase detector and a feedback signal from a register, wherein the register receives the frequency offset.

16. The method of claim 11, further comprising implementing a minimum and maximum detector that receives an accumulated phase output and that detects a maximum accumulated phase output and a minimum accumulated phase output used to generate an accumulated phase output offset.

17. The method of claim 16, further comprising implementing an adder/subtractor circuit configured to receive the accumulated phase offset and an accumulated phase output mean, wherein the adder/subtractor circuit generates an accumulated phase output upper threshold and an accumulated phase output lower threshold.

18. The method of claim 17, further comprising implementing a crossing detector configured to receive the accumulated phase output mean, the accumulated phase output upper threshold and the accumulated phase output lower threshold, and to generate crossing signals.

19. The method of claim 18, wherein the false lock detection circuit is configured to identify a false lock of the receiver circuit in response to the crossing signals.

20. The method of claim 18, further comprising implementing a frequency offset calculator coupled to the crossing detector, wherein the frequency offset calculator generates the frequency offset that is coupled to the frequency path circuit to correct the phase of the output of the phase detector.

* * * * *